United States Patent [19]

Allman

[11] Patent Number: 5,152,834
[45] Date of Patent: Oct. 6, 1992

[54] SPIN-ON GLASS COMPOSITION

[75] Inventor: Derryl D. J. Allman, Colorado Springs, Colo.

[73] Assignee: NCR Corporation, Dayton, Ohio

[21] Appl. No.: 732,009

[22] Filed: Jul. 18, 1991

Related U.S. Application Data

[63] Continuation-in-part of Ser. No. 582,570, Sep. 14, 1990.

[51] Int. Cl.⁵ .......................................... C09D 183/06
[52] U.S. Cl. ......................... 106/287.13; 106/287.11; 106/287.14; 106/287.16
[58] Field of Search ...................... 106/287.11, 287.13, 106/287.14, 287.16; 524/188; 501/12

[56] References Cited

U.S. PATENT DOCUMENTS

| | | | |
|---|---|---|---|
| 3,402,191 | 9/1968 | Morehouse | 106/13 |
| 3,544,498 | 12/1970 | Holdstock et al. | 106/287.11 |
| 3,615,943 | 10/1971 | Genser | 148/188 |
| 3,832,202 | 8/1974 | Ritchie | 106/287 SE |
| 3,905,823 | 9/1975 | Piskoti | 106/38.22 |
| 3,975,294 | 8/1976 | Dumoulin | 106/287.11 |
| 3,986,997 | 10/1976 | Clark | 260/29.2 M |
| 4,173,490 | 11/1979 | Rotenberg et al. | 106/287.14 |
| 4,338,375 | 7/1982 | Hashimoto et al. | 428/412 |
| 4,439,239 | 3/1984 | Greigger et al. | 106/287.16 |
| 4,447,498 | 5/1984 | Fink et al. | 106/287.11 |
| 4,509,981 | 4/1985 | Sanders, Jr. et al. | 106/287.11 |
| 4,652,618 | 3/1987 | Sumida et al. | 525/478 |
| 4,798,629 | 1/1989 | Wood et al. | 106/287.16 |
| 4,808,653 | 2/1989 | Haluska et al. | 106/287.1 |
| 4,842,901 | 6/1989 | Merrem et al. | 427/387 |
| 4,847,120 | 7/1989 | Gent | 427/387 |
| 4,865,649 | 9/1989 | Kashiwagi et al. | 106/287.16 |
| 4,885,262 | 12/1989 | Ting et al. | 437/231 |
| 4,898,907 | 2/1990 | Haluska et al. | 524/490 |

FOREIGN PATENT DOCUMENTS

| | | |
|---|---|---|
| 112168 | 6/1984 | European Pat. Off. |
| 3014675 | 10/1981 | Fed. Rep. of Germany ........................ 106/287.11 |
| 1097576 | 6/1984 | U.S.S.R. .......................... 106/287.11 |

OTHER PUBLICATIONS

Morimoto and Grant; "Manufacturable and Reliable Spin-On Glass Planarization Process for 1 μm CMOS Double Layer Metal Technology" pp. 411-418.

Primary Examiner—Theodore Morris
Assistant Examiner—David M. Brunsman
Attorney, Agent, or Firm—Richard J. Traverso

[57] ABSTRACT

There is disclosed spin-on glass compositions, preferably for use as coating layers on substrates such as semiconductor silicon wafers, which comprise a solution of a crosslinked polyorganosiloxane having a silane adhesion promoter incorporated therein preferably with a glycoether, glycolether acetate or similar solvent. Also provided are methods for preparing these spin-on glass compositions from polyorganosiloxanes preferably having at least 30 wt. % carbon. These spin-on glass compositions (a) provide layers with improved resistance to $O_2$ concentration variations during etching and are stable at temperatures of up to 500° C. without decomposition, (b) have an extended shelf-life of more than one year, and (c) can fill small spaces with high aspect ratios with low shrinkage and low stress.

20 Claims, No Drawings

SPIN-ON GLASS COMPOSITION

CROSS-REFERENCE TO RELATED APPLICATION

This application is a continuation-in-part of U.S. application Ser. No. 07/582,570, filed Sep. 14, 1990, entitled "Coating Solution for Forming Glassy Layers".

BACKGROUND OF THE INVENTION

The present invention relates to a coating solution used in the production of semiconductor products commonly referred to as a "spin-on glass composition". A spin-on glass composition is a liquid, silica-based composition that can be applied to the surface of a semiconductor wafer and spun with the wafer to provide a coating with a level top surface. With this technique, the spin-on glass composition will fill in any valleys or recessed areas in the surface of the semiconductor wafer that result from the various insulating and conductive regions. The spin-on glass coating is then dried to form a solid layer and is subsequently cured at high temperatures to form a hard silica-based (glassy) layer. This hard layer may be etched in preparation for further processing.

Spin-on glass layers have been used for various purposes in semiconductor devices. For example, they have been used as planarizing layers, gettering layers for the removal of undesirable impurities, insulating layers for the isolation of multilayer metallizations, doping vehicles for semiconductor substrates and diffusion masks for enhancing contrast in photolithography techniques. Non-uniformity is undesirable for all these applications.

There are a number of materials said to be suitable for use as spin-on glass compositions. For example, U.S. Pat. No. 3,615,943 describes a coating solution that contains the reaction products of silicon tetrachloride and acetic anhydride. Alternative methods utilize tetraethoxysilane. For example, U.S. Pat. No. 3,832,202 to Ritchie describes a liquid spin-on silica source which comprises two components, one containing tetraethoxysilane, and the other comprising the reaction product of ethyl alcohol, ethyl acetate and vinyltrichlorosilane. Furthermore, U.S. Pat. No. 4,798,629 to Wood et al. describes a spin-on glass composition that comprises a mixture of tetraethoxysilane, methyltriethoxysilane and dimethyldiethoxysilane in a 2/1/1 relationship to provide a polyorganosiloxane with an atomic weight percent carbon between 25% and 8%, preferably 11% and 9%, based on hydrolyzed organosilane.

Solutions of precondensed polyorganosiloxanes have also been described as suitable spin-on glass compositions. A coating solution which contains a prepolymer of polysilsesquioxane together with a polymer obtained from tetraethoxysilane or tetramethoxysilane is described in EPA 112,168 and Kashiwagi et al., U.S. Pat. No. 4,865,649, describes a coating solution comprising a cohydrozylate of at least two alkoxysilanes where di-, tri-, and tetraalkoxysilanes are utilized.

Despite the various formulations, a number of limitations exist with respect to the production and use of most spin-on glass compositions. Problems of surface damage from subsequent processing, poor adhesion and short shelf life, among others, have limited the utility of these compositions. There is a continuing effort to obtain spin-on glass compositions which overcome these limitations.

Spin-on glass layers unavoidably have some brittleness so that cracks sometimes form during subsequent processing, especially where large thicknesses are necessary to completely fill the recessed areas and provide a level surface. Thick film spin-on glass layers are also subject to detachment from the substrate during subsequent processing. The maximum thickness of coating layers obtained from commercially available spin-glass compositions is about 5,000 Å for this reason. This limitation on thickness limits the applications for the spin-on glass composition. Differential thermal expansion between the spin-on glass layer and the underlying substrate contributes significantly to the cracking of the spin-on glass layer. In order to reduce the effect of differential thermal expansion, the gap between the adjacent peaks must be relatively large. This further limits the use of the spin-on glass composition to lower density (large dimension) semiconductors.

Good adhesion between the spin-on glass composition and the underlying chip surface is essential for successful chip production. Poor adhesion can result in incomplete filling of the recessed areas or surface imperfections (non-uniformity). Good adhesion has been achieved in conventional spin-on glass compositions by keeping the carbon content of the polysiloxane below 28 atomic weight %. Such a practice limits the performance of the spin-on glass composition. For example, Morimoto et al. have reported that spin-on glass planarity increases when the carbon concentration of the polysiloxane is increased from 4% to 28%, (see "Manufacturable and Reliable Spin-On Glass Planarization Process for 1 $\mu$m CMOS Double Layer Metal Technology", 5th Int'l. VLSI Multilevel Interconnect Conference, Santa Clara, Calif.; Jun. 13–15, 1988).

Instability is also a problem for most spin-on glass compositions. Spin-on glass compositions typically have a shelf life of less than six months, which makes it difficult to maintain stocks of large quantities.

A further limitation on spin-on glass compositions has been that the coating layers produced have a dielectric constant which falls in the range of 4–6. This is somewhat higher than the dielectric constant of pure silicon dioxide ($SiO_2$), which is 3.9. The high dielectric constant requires that there be more space between electrically isolated devices in order to provide equivalent insulating characteristics.

Another disadvantage of spin-on glass compositions has been that it is difficult to control the plasma etch rate of the layers produced since they are sensitive to the $O_2$ concentration. A typical etching process uses a plasma such as a mixture of $CHF_3$ and $O_2$. When the underlying oxide is exposed, it releases additional oxygen into the plasma, causing a significant increase in the etch rate of the spin-on glass layer. This can result in the formation of recesses and a loss of surface planarity. Effective spin-on glass compositions which overcome these limitations have been provided in copending application Ser. No. 07/582,570, filed Sep.14, 1990, assigned to the same assignee as the present invention, and entitled "Coating Solution for Forming Glass Layers." However, there is a continuing interest in providing spin-on glass compositions which can fill spaces with higher aspect ratios (height/width) and form layers of greater thickness.

OBJECTS OF THE INVENTION

It is, therefore, an object of the present invention to provide a spin-on glass composition which will provide layers with superior adhesion to a substrate and superior resistance to damage (cracking) from subsequent processing.

It is another object of the present invention to provide a process for producing a spin-on glass composition which will provide layers with improved adhesion to semiconductor substrates and improved resistance to surface damage from subsequent processing to permit a single planarizing layer to be used.

It is another object of the present invention to provide a spin-on glass composition having a shelf life in excess of one year.

It is a further object of the present invention to provide a spin-on glass composition that will form layers which are resistant to oxygen concentration fluctuations when etching with $CHF_3$.

It is a further object of this invention to provide a spin-on glass composition that can fill spaces of 0.2 µm in width with aspect ratios (h/w) greater than 8.

It is a further object of the present invention to provide a spin-on glass composition that will form layers with low shrinkage, preferably below 5%.

It is a further object of the present invention to provide a spin-on glass composition that will form layers of higher density with improved resistance to $O_2$ ashing.

It is a further object of the present invention to provide spin-on glass layers with a dielectric constant lower than pure silicon dioxide ($SiO_2$) layers, i.e., below 3.9.

It is a further object of the present invention to provide spin-on glass layers in excess of 9,000 Å in thickness without cracking when subsequently processed.

In another aspect, it is an object of the present invention to provide a method which can produce silicabased layers in excess of 9,000 Å on a semiconductor wafer from a spin-on glass composition.

In another aspect, it is an object of the present invention to provide a semiconductor device having a silica-based layer in excess of 9,000 Å thickness derived from a spin-on glass composition.

Upon further study of the specification and appended claims, further objects and advantages of this invention will become apparent to those skilled in the art.

SUMMARY OF THE INVENTION

The above objects are achieved in providing the spin-on glass composition described below and the methods for its production and use The spin-on glass composition of this invention comprises a solution of a crosslinked polyorganosiloxane with from 1 wt. % to less than about 10 wt. % of an organofunctional silane adhesion promotor incorporated therein. The crosslinked polyorganosiloxane preferably comprises at least 30 atomic wt. % of carbon. Preferably, the solution comprises a glycolether or glycolether acetate as the solvent. The silane adhesion promoters include aminoorganotri-($C_1$–$C_4$)alkoxysilanes. The crosslinked polyorganosiloxanes can be characterized as polysilsesquioxanes due to the extent of crosslinking.

This invention also provides a process for producing a spin-on glass composition which comprises dissolving a polyorganosiloxane, preferably having a carbon content of at least 30 atomic weight percent, in an inert organic solvent, refluxing the solution to increase polymer crosslinking, reacting the dissolved crosslinked polyorganosiloxane with a siloxane adhesion promoter under alkaline conditions and reducing the pH of the reaction medium sufficiently to arrest the reaction between the crosslinked polyorganosiloxane and the silane adhesion promoter.

This invention further provides a method of forming a silica-based layer in a semiconductor device which comprises applying a spin-on glass composition of the present invention to a semiconductor wafer, spinning said semiconductor wafer at speeds which provide a uniform layer of the spin-on glass composition, drying the layer on said semiconductor wafer and heating said semiconductor wafer to a temperature sufficiently high to cure the dried spin-on glass layer.

Also provided are semiconductor devices having a silica-based layer derived from a spin-on glass composition of this invention.

DESCRIPTION OF A PREFERRED EMBODIMENT

The spin-on glass composition of the present invention is a solution of a crosslinked polyorgano-siloxane, preferably having a carbon content of at least 30 atomic weight % carbon which has 1 wt. % to less than about 10 wt. % of a silane adhesion promoter incorporated therein. The solution comprises an inert organic solvent, preferably a glycolether, a glycolether acetate or a mixture thereof, which may be diluted with a volatile solvent such as n-butanol.

To achieve a high carbon content, the backbone of the crosslinked polyorganosiloxane is derived from a mixture of alkoxysilanes. Some or all of which are substituted with organic radicals, preferably $C_1$–$C_4$-alkyl radicals and phenyl radicals. The carbon content is determined by the number of such organosubstituted alkoxysilanes incorporated in the polymer chain.

The preferred substituents are methyl and phenyl radicals. These substituents show high bonding energy with silica and do not dissociate when the spin-on glass layer is exposed to high temperatures during cure. Other alkyl substituents such as ethyl, propyl and butyl radicals are also acceptable and show no dissociation at temperatures as high as 500° C.

In preferred embodiments, the crosslinked polyorganosiloxane has both methyl and phenyl radicals as substituents. Spin-on glass compositions having only phenyl substituents on the siloxane polymer provide layers which are difficult to etch with conventional equipment. The ratio of methyl to phenyl substituents preferably ranges from 1:1 to 1:3. Most preferably, a portion of the silica atoms in the crosslinked polyorganosiloxane have both methyl and phenyl substituents bonded thereto. This can be accomplished where the crosslinked polyorganosiloxane is derived from methylphenylalkoxysilanes. Such crosslinked polyorganosiloxanes provide coating layers with excellent resistance to cracking from subsequent processing.

The high organic content contributes to a low silanol content and low alkoxy content in the crosslinked polyorganosiloxanes used within the spin-on glass compositions. Preferably, the silanol content is less than 1.5 wt. % and the alkoxy content is less than 0.1 wt. %. These low values are also attributed to the crosslinks in the polymer.

The carbon content of the crosslinked polyorganosiloxane can be determined using thermal gravimetric analysis, wherein a weighed sample is decomposed as it is heated slowly in a thermoanalyzer. The weight of the residue is then compared to the initial weight and the difference is considered lost organic material.

Incorporated within the crosslinked polyorganosiloxane used in the spin-on glass compositions of the present invention is a silane adhesion promoter. These silanes are well known in the in the industry for improving the adhesion between organic resins and inorganic media such as glass, sand or fillers. These silane adhesion promoters have two types of substituents, one is an organofunctional radical bonded directly to the silicon atom and the other is an organic substituent bound through oxygen such as $C_1$–$C_4$-alkoxy or $C_2$–$C_4$-acetoxy. These alkoxy/acetoxy groups allow for incorporation of the silane into the crosslinked polyorganosiloxane. Preferably, the organofunctional silane has three $C_1$–$C_4$ alkoxy groups and, most preferably, they are ethoxy or methoxy.

The organofunctional groups are typically electrophilic. Commercially available silane adhesion promoters have aminoorgano-, ureidoorgano- or glycidoxyorgano-functional groups. Aminoorganotri($C_1$–$C_4$)alkoxysilanes are preferred, examples of which include gamma-aminopropyltriethoxysilane, gamma-aminopropyltrimethoxysilane, N-beta-(aminoethyl)-gamma-aminopropyltriethoxysilane and N-beta-(aminoethyl)-N-beta-(aminoethyl)gamma-aminopropyltrimethoxysilane. The most preferred organofunctional silane adhesion promoter is gamma-aminopropyltriethoxysilane. The aminoorganotri($C_1$–$C_4$)alkoxysilanes are preferably incorporated at levels of from 1 wt. % to less than about 10 wt. % of the crosslinked polyorganosiloxane obtained.

The crosslinked polyorganosiloxane polymers produced can be characterized as polyorganosilsesquioxanes due to the level of crosslinking therein. The incorporation of the silane adhesion promoter typically contributes to the degree of crosslinking. However, the low levels of adhesion promoter utilized of less than about 10 wt. % requires there be significant crosslinking in the polyorganosiloxane started with. These crosslinks can be formed on synthesis of the polymers from selected silanes and/or, preferably, the degree of crosslinking between polyorganosiloxane polymers is enhanced by refluxing a solution of the polymers to achieve an increase in viscosity of the solution under a nitrogen blanket. Excessive refluxing can cause gel to form.

The crosslinked organopolysiloxanes used in the spin-on glass compositions of the present invention may have a structure consistent with the "cubical octamer" structure, double chain "ladder" structure or both. A. J. Barry et al. describe these structures in Chapter 5 of *Inorganic Polymers*, Ed. Stone and Graham, New York, Academic Press, 1962, p. 195. These are complicated structures which result from the trifunctionality of the trialkoxysilanes having but one organic group on each silicon atom. Although tetraalkoxysilanes and diorganoalkoxysilanes can be incorporated in these polymers, a significant portion of the polymer is derived from trifunctional silanes.

The weight average molecular weight of the crosslinked polyorganosiloxane polymer with adhesion promoter incorporated therein used in the spin-on glass composition of the present invention may range from about 2,000 up to above 20,000. The only limits on the polymer molecular weight are that the polymer must remain soluble in an inert organic solvent and that the solution formed be sufficiently low in viscosity to allow uniform coating. In the spin-on glass compositions of this invention, the crosslinked polyorganosiloxane is in solution, preferably at a concentration of from about 5 to 20 wt. % solids.

The glycolether/glycolether acetate solvents which dissolve the crosslinked polyorganosiloxane polymers may be diluted with other solvents to obtain the desired viscosity after reflux. Suitable solvents include monohydric and polyhydric alcohols and other glycolethers. The following are mentioned as examples of suitable monohydric alcohols: 1-butanol, 2-butanol, 2-methyl-1-propanol, 2-methyl-2-propanol and 1-phenol. Suitable polyhydric and oligomeric alcohols, some of which can be used in advance of the refluxing step, are: ethyleneglycolmonoethylether, diethyleneglycolmonoethylether, triethyleneglycolmonoethylether, propyleneglycolmonoethylether, dipropyleneglycolmonoethylether and dipropyleneglycolmonomethylether. Mixtures of these alcohols are also suitable. To facilitate drying, the inert organic solvent used to dilute the solution should have a boiling point below 250° C., preferably above 80° C. Preferably, N-butanol and isopropyl are used to dilute the solution.

The spin-on glass composition of the present invention has a pH in the range of 3-7, preferably from 6-6.7. The acidic pH is provided by an organic acid such as acetic acid and formic acid or hydrogen peroxide. The preferred acid is acetic acid. The viscosity of the spin-on glass composition preferably ranges from about 3.5 to 10 centistokes at the preferred solids level of 5 to 20 wt. %. If the viscosity is too low, multiple coats are necessary to obtain a thick spin-on glass layer. If the viscosity is too high, uniformity may be difficult to achieve when coating a substrate. It is also difficult to bake the solvents out of highly viscous compositions after coating onto a substrate. It is preferable for all solvents to be removed in less than one minute at 200° C. for a 3000 Å coating. Thicker coatings require more time.

The spin-on glass compositions of the present invention are stable, i.e., they do not increase in viscosity at ambient temperature for periods in excess of one year.

The method of this invention for preparing spin-on glass compositions involves dissolving a polyorganosiloxane, preferably having a carbon content of at least 30 wt. %, within an inert organic solvent such as an ether alcohol, preferably a glycolether, glycolether acetate or mixture thereof. These solvents have a boiling point of less than 250° C. and typically greater than 80° C. Suitable glycolethers include glycolethylether, glycolbutylether and glycolpropylether. Another suitable ether alcohol is 2-ethoxy propanol. Suitable glycolether acetates include ethylene diacetates. These solvents may be diluted to some extent with other solvents as described above.

Polyorganosiloxanes with a high carbon content can be obtained by cohydrolyzing a mixture of alkoxysilanes, some or all of which are substituted with organic radicals, preferably $C_1$–$C_4$-alkyl and phenyl radicals. As precursors to the polymers in the spin-on glass composition of the present invention, these polyorganosiloxane contain the desired level of methyl and phenyl substituents. Therefore, the methyl to phenyl ratio preferably ranges from 1:1 to 1:3, as in the crosslinked polyorganosiloxanes described above. Furthermore, these polyorganosiloxanes will contain those silicon atoms having both methyl and phenyl groups bound thereto.

The polyorganosiloxanes used in the process of this invention may be linear or they may have a significant number of crosslinks to the extent that they are polysilsesquioxane polymers. They are limited in structure and molecular weight only to the extent that they must remain soluble within an inert organic solvent.

Two or more polyorganosiloxanes may be used in varying proportions in the process of this invention to provide the spin-on glass compositions. However, it is preferable if blends are not used so as to ensure a consistent structure.

The silanol content of the polyorganosiloxanes are low due to the high organic content and sometimes, also due to crosslinking. Preferably, the silanol content is below 13 wt. % and the alkoxy content is less than 10 wt. %.

The carbon content in the preferred polymethylphenylsiloxanes ranges from about 40–50 atomic weight percent; however, the polyorganosiloxanes with a higher carbon content are suitable.

The viscosity of the dissolved polyorganosiloxane solution is increased to provide thicker SOG layers. Preferably, this is accomplished by increasing the number of crosslinks between the polymers. Refluxing the polymer solution is the preferred means for enhancing the number of crosslinks between the polymers. Solutions of polyorganosiloxane, obtained commercially, such as polymethylphenylsilsesquioxane, are preferably refluxed under nitrogen for about 4 to 8 hours. If refluxing for more than 8 hours is desired, the solution should be carefully monitored for the formation of gel. Refluxing is preferably carried out at a temperature in the range of 90°–180° C. with a solvent as described above. The glycolether/glycolether acetate solvents solubilize the crosslinked polyorganosiloxane products sufficiently to avoid the formation of striations in solution. These striations are indicative of poor solubility and high viscosity, which inhibit the formation of uniform coatings. After refluxing, the solution of crosslinked polyorganosiloxanes is cooled.

The solution of crosslinked polyorganosiloxane is reacted with a silane adhesion promoter, preferably an aminoorganotri-($C_1$–$C_4$)-alkoxysilane, most preferably gamma-aminopropyltriethoxysilane, under alkaline conditions, preferably with continuous stirring. The aminoorganotri($C_1$–$C_4$)alkoxysilanes are sufficiently alkaline so as not to require addition of a base to the solution. Where the silane adhesion promoter is nonalkaline, it is expected a volatile organic amine may be introduced to promote reaction. The pH of the reaction medium is preferably 11 or above.

The amount of silane adhesion promoter reacted with the polyorganosiloxane can vary widely, but is used in an amount wherein the silane incorporated comprises 1% to below about 10 wt. % of the resulting polyorganosiloxane product, most preferably from 1% to 5 wt. % of such product.

The pH of the reaction medium is reduced when it is desirable to slow down or arrest the reaction. The duration of the reaction will depend on the reaction rate, which is influenced by temperature. Allowing the reaction to proceed for 4 to 8 hours is preferred when conducted at ambient temperature. The spin-on glass composition of this invention does not form a precipitate even after reaction periods of more than 8 hours. A reaction that proceeds for two hours or more at ambient temperature will be effective in producing spin-on glass compositions.

To substantially arrest the reaction, the pH should be reduced below 7, but not below 3.0, or acid catalyzed hydrolysis will proceed. The preferred pH range is 5 to below about 7, most preferably 6 to 6.5. This can be accomplished by the addition of an organic acid, such as acetic acid and formic acid or hydrogen peroxide. The use of acetic acid is preferred.

Once the reaction has been stopped, it is preferable to dilute the composition before aging, preferably for about one week, prior to use. It is also preferable to filter the solution with a submicron filter, such as a 0.2 or 0.1 micron teflon filter, so as to remove any impurities or precipitate that should be present. composition will remain stable thereafter for periods in excess of one year. The composition will typically have a viscosity of from 3.5 to 35 centistokes. It may be desirable to dilute the solution with a suitable solvent as described above to obtain the desired viscosity for coating substrates. Coating compositions with a viscosity of up to 10 centistokes have been found to be preferred.

The spin-on glass composition of this invention can be applied to a substrate by a conventional spin-coat technique wherein a substrate (wafer) is spun at a rate in excess of 1,000 rpm to generate a uniform layer of the spin-on glass composition. The thickness of the layer can be modified by varying the viscosity of the spin-on glass composition. The spin-on glass composition is then dried by heating the wafer to about 200° C. Layers in excess of 9,000 Å and up to 24,000 Å can be obtained by multiple applications. Spaces of 0.2 μm in width with aspect ratios greater than 8 (h/w) can be planarized. After the coating is dried, the coated substrate is heated to a temperature of from about 275–500° C. to cure the spin-on glass coating and form a smooth, uniform silica-based layer. The spin-on glass composition preferably exhibits low shrinkage once dried. Vertical shrinkage as high as 11% may be acceptable, however, it is preferable for shrinkage to be below about 5%, which is easily obtained with preferred embodiments.

Spin-on glass compositions of the present invention can provide uniform oxide layers in excess of 9,000 Å without cracking or loss in subsequent processing. Therefore, complete operational semiconductor devices may have incorporated therein silica-based layers derived from a spin-on glass composition of the present invention.

The dielectric constant of these silica-based layers is less than 2.5, i.e., about 2.4, at 1 MHz, which is below that of silicon dioxide (3.9) and below that of conventional spin-on glass materials (4.5). The volume resistivity is greater than $1 \times 10^{11}$ ohm-cm.

The silica-based layers provided by the spin-on glass compositions of the present invention show superior resistance to ashing caused by $O_2$ radical chemical plasma etch when etching with $CHF_3$ and $O_2$, particularly where the crosslinked polyorganosiloxane contains a large number of phenyl radicals. These silica-based layers are therefore also resistant to changes in etch rate from changes in oxygen content. A change in etch rate of less than 100 Å per minute is typical where the oxygen flow rate during etch with $CHF_3$ is increased from 6 to 9 SCCM. For layers obtained from conventional spin-on glass compositions, such as Accuglass 108, which has a carbon content of about 13 wt. %, the etch rate increases by more than 100 Å per minute.

Dopants such as phosphorous and boron may be introduced into the spin-on glass compositions of the present invention where a dopant layer is desired. Conventional dopant concentrations (about 5 wt. % to 30 wt. %) are suitable. It is preferable to reflux the cross-linked polyorganosiloxanes to incorporate phosphorous into the spin-on glass composition.

The spin-on glass compositions of this invention can be used to form silica-based coating layers on substrates such as semiconductors, silica wafers, glass plates, metal plates and the like by any known method including the spin method, roller coater method, dipping and pullup method, spray method, screen printing method, brushing method and the like.

Without further elaboration, it is believed that one skilled in the art can, using the preceding description, utilize the present invention to its fullest extent. The following preferred specific embodiments are, therefore, to be construed as merely illustrative and not limitative of the remainder of the disclosure in any way whatsoever.

In the foregoing and in the following examples, all temperatures are set forth in degrees Celsius; and, unless otherwise indicated, all parts and percentages are by weight.

The entire disclosure of all applications, patents, and publications, cited above and below, are hereby incorporated by reference.

EXAMPLE

A spin-on glass composition is prepared by dissolving 25 g of polymethylphenylsiloxane polymer in 50 grams of ethylene diacetate. The polymer is obtained from Owens, Illinois as solid flakes. The silanol content of the polymer is about 13% to 14% by weight and the ethoxy content is about 8% by weight. The carbon content is above 40 atomic weight percent as determined by thermal gravimetric analysis of an earlier sample, wherein the sample is weighed and heated up to 600° C. at a rate of 2° C. per minute and cooled at the same rate to ambient temperature. The residue is weighed after cooling and the weight loss is taken as the carbon content. A quantity of aluminum oxide is heated alongside the resin sample to show no weight loss or gain from the thermal gravimetric analysis.

The polyorganosiloxane is dissolved in the ethylene diacetate within one half hour, after which, the solution is refluxed at 90°-100° C. for 4 to 6 hours. The solution is allowed to cool to room temperature (about 23° C.) and 0.7. ml of gamma-aminopropyltriethoxysilane is added by pipet with stirring within one minute. The silane is distilled from a silane solution sold by Union Carbide under the designation A1100. The solution is maintained at a constant temperature (23° C.) during reaction, which is allowed to continue for about 8 hours with stirring, after which 0.7-1.0 ml of acetic acid (electronic grade) is added and a precipitate forms within the solution.

After the addition of acid, the pH falls between about 6.0 to 6.5. The solution is aged for one week and subsequently filtered to 0.2 or 0.1 micrometers with a teflon filter to remove the precipitate. The solids concentration of the solution is about 6 wt. % and the viscosity is about 4 centistokes. The polymethylphenyl-silsesquioxane polymer produced has a silanol content of about 1.5% and an alkoxy content of less than 0.1%.

Spin-On Glass Layer

About 1 g of the above solution is applied to a silicon wafer 4 inches in diameter. The wafer is rotated on a spinner for about 3 seconds at 1000 rpm and then at 4,500 rpm for 30 seconds. The composition coats the wafer uniformly without bubble formation or blistering. The wafer is then transferred to an Ellipsometer to determine thickness and refractive index at different points on the wafer. The refractive index has an average value of about 1.5 and the average thickness is about 3000 Å. Following the measurement, the wafer is transferred to a hot plate and heated to about 200° C. for 1 minute to dry the coating. The coating thickness and refractive index are measured again with the Ellipsometer and percent vertical shrinkage is calculated to be less than 5%.

The coating procedure is repeated until the multiple layers has a total thickness in the range of 4,000-24,000 Å.

Once the desired thickness is obtained, the wafer is transferred to a tube furnace and heated to about 400° C. under nitrogen for 60 minutes. The centers of the wafers are then measured using an Ellipsometer to determine the index of refraction and the thickness of the wafer at 9 points, the average of these values are reported as the coating thickness and refractive index. The refractive index is about 1.49 and the average thickness is within the range of 5,000-6,000 Å, with shrinkage less than 2% following the hot plate bake at 200° C. prior to final curing. No cracks or pin holes are detected in the coating.

Aging Test

An accelerated aging test is used to determine the stability of the spin-on glass compositions of the present invention. A spin-on glass composition produced in accordance with the procedure described above is stored at 55° C. after filtration together with a separate sample of the commercially available spin-on glass composition, Accuglass 110, available from Allied Chemical. Accuglass 110 is known to have a shelf life of 6 months at ambient temperature. The viscosity values of both samples are monitored over time when stored at this temperature. The viscosity of the Accuglass 110 steadily increases and eventually a precipitate forms, while the sample produced in accordance with this invention does not show any indication of an increase in viscosity during that same period. When compared to the stability of Accuglass 110, the composition of the present invention will have a shelf life beyond one year.

Etching Process

A silica-based film prepared as described above is subjected to etch with $CHF_3$ and $O_2$ in an AME 8110 unit. The etch rate for a number of samples are determined with different oxygen flow rates. The etch rates of silicabased films obtained from two commercially available spin-on glass compositions are also tested at different oxygen flow rates. Results are given in the table below:

TABLE 1

| $O_2$ Flow Rate SCCM | Etch Rate Å/min | | |
|---|---|---|---|
| | Example 1 (400° C.) | $ACC^1$ 108 (425° C.) | $ACC^2$ 110 (425° C.) |
| 4 | | | 150 |
| 5 | | 120 | 175 |
| 6 | 50 | | |
| 7 | | 190 | 225 |
| 8 | 75 | | |

TABLE 1-continued

| O$_2$ Flow Rate SCCM | Example 1 (400° C.) | ACC[1] 108 (425° C.) | ACC[2] 110 (425° C.) |
|---|---|---|---|
| 9 | | 280 | 350 |
| 10 | 100 | | |
| 13 | 150 | | |
| 15 | 170 | | |

[1] ACC 108 = Accuglass 108 (Allied Chemical).
[2] ACC 110 = Accuglass 110 (Allied Chemical).

The data in Table 1 shows the high resistance of the silica-based layers produced by the composition of the present invention to changes in the oxygen concentration when etching with CHF$_3$. An etch rate which matches that of a plasma oxide can be obtained at high oxygen flow rates. (15 ccm to 18 ccm). The release of oxygen from the underlying oxide during etch will have little effect on O$_2$ concentration at these high oxygen flow rates, allowing for a more uniform etch across the surface of a semiconductor wafer.

From the foregoing description, one skilled in the art can easily ascertain the essential characteristics of this invention and, without departing from the spirit and scope thereof, can make various changes and modifications of the invention to adapt it to various usages and conditions.

What is claimed is:

1. A process for producing a spin-on glass composition, which comprises:
   providing a solution of crosslinked polyorganosiloxane polymer having an atomic carbon content of at least 30 weight percent in an inert organic solvent which does not contain a gel,
   reacting the crosslinked polyorganosiloxane with a silane adhesion promoter under alkaline conditions in the absence of a platinum catalyst in an amount which provides from 1 wt. % to less than about 10 wt. % of the resulting polyorganosiloxane product; and
   reducing the pH of the reaction medium sufficiently to arrest the reaction between the crosslinked polyorganosiloxane and the silane adhesion promoter.

2. A process as in claim 1, wherein the silane adhesion promoter has at least one C$_1$-C$_4$-alkoxy group or C$_2$-C$_4$-acetoxy group and at least one aminoorgano, ureidoorgano or glycidoxyorgano group.

3. A process as in claim 1, wherein the silane adhesion promoter is an aminoorganotrialkoxysilane wherein the alkoxy groups have from one to four carbon atoms.

4. A process for producing a spin-on glass composition, which comprises:
   providing a solution of crosslinked polyorganosiloxane polymers having an atomic carbon content of at least 30 weight percent in an inert organic solvent having a boiling point of from 80° C. to 250° C. which does not contain a gel,
   reacting the crosslinked polyorganosiloxane with an aminoorganotrialkoxysilane in an amount which provides from 1 to 5 wt. % of the resulting polyorganosiloxane product under alkaline conditions in the absence of a platinum catalyst for about 4-8 hours wherein the alkoxy groups have one to four carbon atoms, and
   reducing the pH of the reaction medium to a value below 7 to arrest the reaction between the crosslinked polyorganosiloxane and aminoorganotrialkoxysilane after about 4-8 hours.

5. A process as in claim 4, wherein the aminoorganotrialkoxysilane is selected from gamma-aminopropyltriethoxysilane, gamma-aminopropyltrimethoxysilane, N-beta-(amino-ethyl)-gamma-aminopropyltrimethoxysilane and N-beta-(amino-ethyl)-N-beta-(amino ethyl)-gamma-aminopropyltrimethoxysilane.

6. A process as in claim 4, wherein the crosslinked polyorganosiloxane has less than 13 weight percent silanol groups and less than 10 weight percent alkoxy groups.

7. A process as in claim 4, wherein the crosslinked polyorganosiloxane has an atomic carbon content of from 40 to 50 weight percent.

8. A process as in claim 4, wherein the polyorganosiloxane is a polymethylphenylsiloxane.

9. A process as in claim 8, wherein the ratio of methyl to phenyl radicals falls within the range of 1:1 to 1:3.

10. A process as in claim 9, wherein a portion of the methyl and phenyl radicals are bonded to the same silicon atom.

11. A process as in claim 4 comprising the additional step of filtering the polyorganosiloxane solution with a filter of submicron pore size following the reduction of the pH with the addition of organic acid.

12. A process for producing a spin-on glass composition comprising:
   providing a solution of crosslinked polymethylphenylsilsesquioxane polymers in an inert organic solvent having a boiling point of form 80° C. to 250° C. which does not contain a gel,
   reacting the crosslinked polymethylphenylsilsesquioxane polymers with gamma-aminopropyltriethoxysilane under alkaline conditions in the absence of a platinum catalyst for about 4-8 hours in an amount which provides 1 wt. % to less than about 10 wt. % of the resulting polyorganosiloxane polymer, and
   adjusting the pH of the solution to a value between 6 and 6.7 after 4-8 hours with an organic acid,
   wherein the polymethylphenylsilsesquioxane polymers have an atomic carbon content in the range of 40 to 50 weight percent, has less than 13 wt. % silanol groups, less than 10 wt. % alkoxy groups and the ratio of methyl to phenyl groups falls within the range of 1:1 to 1:3, with a portion of the methyl and phenyl radicals bonded to the same silicon atom.

13. A coating solution for forming glassy layers comprising a solution of crosslinked polyorganosiloxane which has at least 30 atomic weight percent carbon and from 1 wt % to less than about 10 wt. % of a silane adhesion promoter incorporated therein.

14. A spin-on glass composition comprising a solution of crosslinked polyorganosiloxane which has at least 30 atomic weight percent carbon and from 1 wt. % to less than about 10 wt. %, based on the weight of the polymer, of an aminoorganotrialkoxysilane incorporated therein, wherein the alkoxy groups have from 1-4 carbon atoms.

15. A spin-on glass composition as in claim 14, wherein from 1 to 5 weight percent of the crosslinked polyorganosiloxane is derived from the aminoorganotrialkoxysilane.

16. A spin-on glass composition as in claim 14, wherein the silanol content is below 1.5 weight percent and the alkoxy content is below 0.1 weight percent in the crosslinked polyorganosiloxane.

17. A spin-on glass composition comprising a solution of polymethylphenylsilsesquioxane having a carbon content of at least 30 weight percent and from 1 wt. % to less than about 10 wt. %, based on the weight of the polymer, of an aminoorganotrialkoxysilane incorporated therein, wherein the alkoxy groups have from 1–4 carbon atoms.

18. A spin-on glass composition as in claim 17, wherein the aminoorganotrialkoxysilane is gamma-aminopropyltriethoxysilane and polymethylphenylsilsesquioxane has from 1 to 5 wt. % gamma-aminopropyltriethoxysilane incorporated therein.

19. A spin-on glass composition as in claim 17, wherein the polymethylphenylsilsesquioxane has from 40 to 50 atomic weight percent carbon and a portion of the methyl and phenyl radicals are bonded to the same silicon atom.

20. A spin-on glass composition as in claim 17, which additionally comprises n-butyl alcohol and acetic acid.

* * * * *